US012659057B2

(12) United States Patent (10) Patent No.: US 12,659,057 B2
Ikebe et al. (45) Date of Patent: Jun. 16, 2026

(54) RADIO TERMINAL TEST APPARATUS AND RADIO TERMINAL TEST METHOD

(71) Applicant: ANRITSU CORPORATION, Kanagawa (JP)

(72) Inventors: Takasumi Ikebe, Kanagawa (JP); Nozomu Hikino, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 730 days.

(21) Appl. No.: 18/154,979

(22) Filed: Jan. 16, 2023

(65) Prior Publication Data

US 2023/0254055 A1 Aug. 10, 2023

(30) Foreign Application Priority Data

Feb. 9, 2022 (JP) .................................. 2022-018622

(51) Int. Cl.
*H04B 17/29* (2015.01)
*G01R 29/10* (2006.01)

(52) U.S. Cl.
CPC ........... *H04B 17/29* (2015.01); *G01R 29/105* (2013.01)

(58) Field of Classification Search
CPC .............................. H04B 17/29; G01R 20/105
USPC ........................................................ 455/67.12
See application file for complete search history.

(56) References Cited

U.S. PATENT DOCUMENTS

| | | | | |
|---|---|---|---|---|
| 7,156,730 B1 * | 1/2007 | Blaine | .................. | A22C 17/002 |
| | | | | 452/150 |
| 7,366,263 B2 * | 4/2008 | Terao | .................. | H04B 7/0811 |
| | | | | 375/267 |

| | | | | |
|---|---|---|---|---|
| 9,531,950 B2 * | 12/2016 | Tanaka | .................. | H04N 1/407 |
| 10,263,714 B2 * | 4/2019 | Aoki | .................... | H04B 17/102 |
| 10,365,345 B1 * | 7/2019 | Bradley | .................. | H04B 1/40 |
| 11,251,879 B1 * | 2/2022 | Wu | .................... | H04B 17/0085 |
| 11,892,498 B2 * | 2/2024 | Ikebe | ...................... | H04M 1/24 |
| 12,439,519 B2 * | 10/2025 | Ikebe | .................... | H05K 1/144 |
| 2004/0079877 A1 * | 4/2004 | Hidalgo | ................. | H01J 49/40 |
| | | | | 702/23 |

(Continued)

FOREIGN PATENT DOCUMENTS

JP 6836507 A 3/2021

OTHER PUBLICATIONS

3GPPTR38.803V14.2.0 (Sep. 2017) Technical Specifications 3GPP (Third Generation Partnership Project) published in Sep. 2017.

*Primary Examiner* — April G Gonzales
(74) *Attorney, Agent, or Firm* — McDonald Hopkins LLC

(57) ABSTRACT

A radio terminal test apparatus that tests radio communication performance of a radio terminal, the apparatus including: a radio signal processing unit that performs measurement processing on a radio signal transmitted from the radio terminal and acquires measurement data; a communication control unit that transmits and receives data to and from the radio signal processing unit; and a bus that connects the radio signal processing unit and the communication control unit. The radio signal processing unit includes a division determination unit that determines necessity of division of the measurement data, and, when the division determination unit determines that the measurement data needs to be divided, the measurement data is divided, and divided pieces of the measurement data are division-transmitted a plurality of times from the radio signal processing unit to the communication control unit via the bus.

9 Claims, 7 Drawing Sheets

(56) References Cited

U.S. PATENT DOCUMENTS

| | | | | |
|---|---|---|---|---|
| 2004/0226755 | A1* | 11/2004 | Pottebaum | G01G 19/12 |
| | | | | 177/25.13 |
| 2006/0146741 | A1* | 7/2006 | Muraoka | H04W 52/343 |
| | | | | 370/328 |
| 2013/0045695 | A1* | 2/2013 | Nast | H04B 1/0475 |
| | | | | 455/78 |
| 2013/0211781 | A1* | 8/2013 | Misaki | G04F 3/00 |
| | | | | 702/176 |
| 2013/0267182 | A1* | 10/2013 | Brandt | H04W 52/243 |
| | | | | 455/73 |
| 2014/0180514 | A1* | 6/2014 | Becker | G08C 19/02 |
| | | | | 708/203 |
| 2017/0330364 | A1* | 11/2017 | Yamamoto | G06T 1/00 |
| 2017/0370830 | A1* | 12/2017 | Koseoglu | G01N 21/314 |
| 2020/0119460 | A1* | 4/2020 | Maruo | H01Q 3/18 |
| 2020/0177289 | A1* | 6/2020 | Maruo | H04B 17/103 |
| 2020/0244377 | A1* | 7/2020 | Maruo | H04B 17/102 |
| 2020/0249277 | A1* | 8/2020 | Richter | H02P 27/06 |
| 2021/0055337 | A1* | 2/2021 | Kobayashi | G01R 29/0864 |
| 2021/0247431 | A1* | 8/2021 | Maruo | G01R 29/0871 |
| 2021/0293869 | A1* | 9/2021 | Kobayashi | G01R 29/0878 |
| 2021/0364563 | A1* | 11/2021 | Endo | H04B 17/0087 |
| 2021/0364565 | A1* | 11/2021 | Maruo | H01Q 15/16 |
| 2021/0399811 | A1* | 12/2021 | Endo | H04B 17/102 |
| 2022/0006535 | A1* | 1/2022 | Wu | H04B 17/0085 |
| 2022/0038197 | A1* | 2/2022 | Endo | H04B 17/0085 |
| 2022/0236316 | A1* | 7/2022 | Nakamura | H04B 17/29 |
| 2022/0252653 | A1* | 8/2022 | Morita | G01R 31/003 |
| 2022/0255641 | A1* | 8/2022 | Wu | H04B 17/29 |
| 2024/0271339 | A1* | 8/2024 | Hakoishi | D03D 13/008 |
| 2025/0260496 | A1* | 8/2025 | Endo | G01R 29/0871 |

* cited by examiner

RADIO TERMINAL TEST APPARATUS AND RADIO TERMINAL TEST METHOD

TECHNICAL FIELD

The present invention relates to a radio terminal test apparatus and a radio terminal test method, and more particularly to a radio terminal test apparatus and a radio terminal test method for measuring communication performance of a radio terminal in an over-the-air (OTA) environment.

BACKGROUND ART

In recent years, with the development of multimedia, radio terminals (smartphones and the like) equipped with antennas for radio communication such as cellular and wireless LAN have been actively produced. In the future, in particular, there is a demand for radio terminals that transmit and receive radio signals compatible with IEEE 802.11ad, 5G cellular, and the like, which use wideband signals in the millimeter wave band.

In a manufacturing plant of a radio terminal, a performance test as follows is performed on a radio communication antenna of the radio terminal: an output level of a transmission radio wave defined for each communication standard or reception sensitivity is measured, and it is determined whether or not to satisfy a predetermined criterion.

A test method is also changing along with the generation shift of radio terminals. For example, in a performance test in which a radio terminal for the 5G NR system (New Radio System) (referred to as a 5G radio terminal below) is set as a device under test (DUT), an OTA test using an anechoic box (OTA chamber) referred to as a compact antenna test range (referred to as a CATR below) that is not influenced by the surrounding radio wave environment is performed.

In the OTA test, the DUT and a test antenna are accommodated in the CATR, and a radio signal in a frequency band (target frequency band) used by a DUT antenna (referred to as an antenna under test) is measured while transmission of a test signal to the DUT from the test antenna and reception of a measurement target signal transmitted from the antenna under test that has received the test signal, by the test antenna, are performed by radio communication.

In particular, for the OTA test targeting 5G radio terminals, not only measurement of radio signals in the target frequency band, but also spurious measurement are obligatory. The spurious measurement is a process of measuring an unintended frequency signal radiated from the DUT antenna during a test, that is, a radio signal (spurious signal) in a spurious frequency band.

As one conventional measurement method for a performance test of radio terminals, a technique as follows is known. A test antenna for spurious measurement is disposed in a near-field region in a CATR. A radio terminal is attached to a positioner, and the positioner is driven to rotate around each of two rotation axes to scan the entire spherical surface. A radio signal radiated from the antenna of the radio terminal during scanning of the entire spherical surface is received in a near field by a test antenna, and the power of the radio signal in each direction is measured (see Patent Document 1, for example).

In addition, as a conventional measurement method for a performance test of 5G radio terminals, a technique of measuring total radiated power (TRP) based on equivalent isotropically radiated power (EARP) samples in a near-field region (excluding a Reactive Near Field) is also known (see Non-Patent Document 1, for example).

RELATED ART DOCUMENT

Patent Document

[Patent Document 1] Japanese Patent No. 6836507

Non-Patent Document

[Non-Patent Document 1] 3GPPTR38.803V14.2.0 (2017 September) Technical Specifications (3GPP (Third Generation Partnership Project) published in September 2017, Section of OTA measurements in the radiative near field (pages 159 to 161) in Chapter 10.2.2.5)

DISCLOSURE OF THE INVENTION

Problem that the Invention is to Solve

The conventional test apparatus used for the OTA test of radio terminals may have a configuration in which a communication control unit that functions as a gateway and a radio signal processing unit that measures the power of radio signals transmitted from the DUT are provided. The conventional test apparatus for the OTA test has a function of generating a test signal to be transmitted from a test antenna to a DUT in accordance with a communication standard, and a function of receiving a measurement target signal transmitted from the antenna under test of the DUT that has received the test signal, via the test antenna, and measuring and analyzing power and the like. This test apparatus is connected to an external control device via a communication control unit. The control device is configured to control a positioner for posture control of the test apparatus and the DUT, perform the OTA test, acquire the measurement result, and display the measurement result on, for example, a display.

Measurement result information (measurement data) obtained by a radio signal processing unit of the test apparatus is transmitted to the communication control unit by a serial transmission method (serial bus) in accordance with an interface standard such as PCIe (registered trademark) (Peripheral Component Interconnect Express). The communication control unit transmits the measurement data transmitted from the radio signal processing unit to the external control device via a network such as Ethernet (registered trademark).

In radio communication by 5G radio terminals, the carrier aggregation technique of bundling radio waves in a plurality of different frequency bands (also referred to as channels or component carriers below), and transmitting and receiving data in one communication line is used. In radio communication using the carrier aggregation technique, the amount of the measurement result data increases in proportion to the number of channels used. For example, when the number of used channels is increased to eight, the amount of the measurement result data increases eightfold compared to the conventional case where the number of used channels is one.

Also, when the TRP is measured, the EIRP is measured at each of angle sample points (measurement points) set to cover the entire spherical surface of a virtual sphere in a polar coordinate system, and thus the volume of the measurement result data increases in proportion to the number of measurement points.

In such a situation in which the data volume of the measurement results rapidly increases with the rapid progress of the radio communication technique, when the measurement result data is transmitted between modules such as the radio signal processing unit and the communication control unit via a bus in the test apparatus, the amount of data transmitted once is limited by the volume of a data transmission memory provided in the module (in particular, the communication control unit).

For example, in radio communication using carrier aggregation with a large number of used channels (for example, eight channels), when the TRP is measured under conditions with a large number of measurement points on the entire spherical surface, the amount of the measurement result data may exceed the expectations at the time of hardware manufacturing. As described above, there is a problem that, when the number of prescribed frequency bands (target frequency bands) for transmission and reception to and from the DUT (the number of channels) increases, the amount of data transmitted between the modules in the test apparatus exceeded a memory size for via-bus data transmission and reception in the module, and thus the measurement result is not correctly processed.

There is a method of replacing the test apparatus with a higher grade one with a larger memory volume, but replacement of the test apparatus only for a specific measurement item, for example, a large amount of measurement data is not worth the cost and takes time and effort. Thus, there is also a need to utilize the known hardware.

The present invention has been made to solve the above-described problems. An object of the present invention is to provide a radio terminal test apparatus and a radio terminal test method capable of reliably transmitting and receiving measurement data to a communication control unit from a radio signal processing unit via a bus at low cost without replacing hardware even when a volume of measurement data exceeds a volume of a memory for data transmission via a bus due to addition, change, and the like of a measurement item.

Means for Solving the Problem

In order to achieve the above object, according to the present invention, a radio terminal test apparatus tests radio communication performance of a radio terminal 4. The radio terminal test apparatus includes a radio signal processing unit 40 that performs measurement processing on a radio signal transmitted from the radio terminal and acquires measurement data D, a communication control unit 10 that transmits and receives data to and from the radio signal processing unit, and a bus 6 that connects the radio signal processing unit and the communication control unit. The radio signal processing unit includes a division determination unit 47 that determines necessity of division of the measurement data. When the division determination unit determines that the measurement data needs to be divided, the measurement data is divided, and divided pieces of the measurement data are division-transmitted a plurality of times from the radio signal processing unit to the communication control unit via the bus.

As described above, in the radio terminal test apparatus in the present invention, the radio signal processing unit includes a division determination unit that determines necessity of division of the measurement data. When the division determination unit determines that the measurement data needs to be divided, the measurement data is divided, and divided pieces of the measurement data are division-transmitted a plurality of times from the radio signal processing unit to the communication control unit via the bus in accordance with a first protocol. With this configuration, even when the volume of the measurement data acquired by the radio signal processing unit exceeds the volume of a memory for data transmission via the bus due to the addition or change of a measurement item, it is possible to reliably transmit and receive measurement data to the communication control unit from the radio signal processing unit at low cost via the bus without replacing hardware.

In the radio terminal test apparatus in the present invention, the division determination unit may be configured to determine the necessity of the division of the measurement data by determining whether or not the measurement data acquired by the radio signal processing unit is larger than volume of a data transmission and reception region allocated in a memory of the communication control unit.

With this configuration, in the radio terminal test apparatus in the present invention, all pieces of measurement data are acquired by the radio signal processing unit, and then it is determined whether or not the measurement data is larger than the volume of a data transmission and reception region allocated in a memory of the communication control unit. Thus, it is possible to reliably determine the necessity of division of the measurement data without considering a measurement condition.

In the radio terminal test apparatus in the present invention, the radio signal processing unit may be configured to further include a condition storage unit 45 that stores a measurement condition. The division determination unit may be configured to calculate, in advance, volume of measurement data scheduled to be acquired by the radio signal processing unit, based on the measurement conditions, and to determine the necessity of the division of the measurement data by determining whether or not the calculated volume is larger than volume of a data transmission and reception region allocated in a memory of the communication control unit.

With this configuration, in the radio terminal test apparatus in the present invention, the volume of the measurement data scheduled to be acquired by the radio signal processing unit is calculated in advance based on the measurement condition, and it is determined in advance whether or not the calculated volume is larger than the volume of the data transmission and reception region allocated in the memory of the communication control unit. Thus, it is possible to quickly divide and transmit measurement data without needing to perform determination processing when the radio signal processing unit acquires the measurement data. The measurement condition includes, for example, a measurement item such as a TRP, the number of component carriers in carrier aggregation, and the total number of angle sample points in the entire spherical surface scanning.

In the radio terminal test apparatus in the present invention, the radio signal processing unit may be configured to further include a data division unit 43 that, when the division determination unit determines that the measurement data needs to be divided, calculates the number of divisions N of the measurement data by an expression $N=\text{ROUNDUP}(V_1/V_2)$, and divides the measurement data in accordance with the number of divisions, where $V_1$ indicates volume of the measurement data, $V_2$ indicates volume of a data transmission and reception region allocated in a memory of the communication control unit, and ROUNDUP indicates rounding-up processing.

With this configuration, in the radio terminal test apparatus in the present invention, the number of divisions of the measurement data can be calculated from the data volume $V_1$ of the measurement data and the volume $V_2$ of the data transmission and reception region allocated in the memory of the communication control unit. Thus, it is possible to reliably divide and transmit the measurement data.

In the radio terminal test apparatus in the present invention, the radio signal processing unit may be configured to acquire measurement data of equivalent isotropically radiated power (EIRP) at each angle sample point by entire spherical surface scanning of the radio terminal that performs radio communication in accordance with a communication standard using carrier aggregation.

With this configuration, in the radio terminal test apparatus in the present invention, it is possible to accurately and reliably measure the TRP by division-transmitting measurement data of EIRP acquired by the radio signal processing unit even in TRP measurement with a large volume of the measurement data, and by obtaining the sum of the EIRP in a transmission destination, for example.

The radio terminal test apparatus in the present invention may be configured to further include a communication protocol processing unit 20 that is connected to the bus and generates transmission data based on a communication protocol defined by a specific communication standard, and a baseband signal processing unit 30 that is connected to the bus and generates a baseband signal from the transmission data. The radio signal processing unit may be configured to generate a radio-frequency test signal from the baseband signal, transmit the radio-frequency test signal to the radio terminal via a test antenna, and receive a radio signal transmitted from the radio terminal that has received the radio-frequency test signal.

With this configuration, in the radio terminal test apparatus in the present invention, a base station of a specific communication standard such as 5GNR can be simulated to test the radio communication characteristics of the radio terminal.

According to the present invention, a radio terminal test system tests radio communication performance of a radio terminal 4. The radio terminal test system includes: a radio terminal test apparatus 1 that includes a radio signal processing unit 40 that performs measurement processing on a radio signal transmitted from the radio terminal and acquires measurement data D, a communication control unit 10 that transmits and receives data to and from the radio signal processing unit, and a bus 6 that connects the radio signal processing unit and the communication control unit, in which the radio signal processing unit includes a division determination unit 47 that determines necessity of division of the measurement data, and, when the division determination unit determines that the measurement data needs to be divided, the measurement data is divided, and divided pieces of the measurement data are division-transmitted a plurality of times from the radio signal processing unit to the communication control unit via the bus; a control device 2 that transmits and receives data to and from the communication control unit via a network 5; an anechoic box 50; a positioner 50 that is accommodated in the anechoic box and controls a posture of the radio terminal under control of the control device; and a test antenna 3 that is accommodated in the anechoic box and performs radio communication with the radio terminal. While the positioner performs entire spherical surface scanning of the radio terminal under control of the control device, the radio signal processing unit measures power of a radio signal radiated from an antenna of the radio terminal via the test antenna.

With this configuration, in the radio terminal test system in the present invention, TRP measurements with a large number of angle sample points on the entire spherical surface can be performed even for a radio terminal conforming to a communication standard that uses carrier aggregation with a large number of channels, for example.

In the radio terminal test system in the present invention, the control device may be configured to include a calculation unit 2a that calculates the total radiated power (TRP) of the radio terminal from the measurement data acquired by the radio signal processing unit.

With this configuration, in the radio terminal test system in the present invention, it is possible to accurately and reliably measure the TRP by division-transmitting measurement data of EIRP acquired by the radio signal processing unit from the radio signal processing unit to the control device via the bus even in the TRP measurement with large volume of measurement data, and by obtaining the sum of the EIRP in the control device.

According to the present invention, there is provided a radio terminal test method in a radio terminal test apparatus that includes a radio signal processing unit 40 that performs measurement processing on a radio signal transmitted from a radio terminal 4 and acquires measurement data D; a communication control unit 10 that transmits and receives data to and from the radio signal processing unit, and a bus 6 that connects the radio signal processing unit and the communication control unit, and tests radio communication performance of the radio terminal. The radio terminal test method includes a division determination step (S5) of determining necessity of division of the measurement data, a data division step (S6) of, when it is determined in the division determination step that the measurement data needs to be divided, calculating the number of divisions and dividing the measurement data in accordance with the number of divisions; and a data transmission step (S8, S9) of division-transmitting divided pieces of the measurement data from the radio signal processing unit to the communication control unit in a plurality of times via the bus.

With this configuration, in the radio terminal test method in the present invention, even when the volume of the measurement data acquired by the radio signal processing unit exceeds the volume of a memory for data transmission via the bus due to the addition or change of a measurement item, it is possible to reliably transmit and receive measurement data to the communication control unit from the radio signal processing unit at low cost via the bus without replacing hardware.

Advantage of the Invention

According to the present invention, it is possible to provide a radio terminal test apparatus and a radio terminal test method capable of reliably transmitting and receiving measurement data to a communication control unit from a radio signal processing unit via a bus at low cost without replacing hardware even when the volume of measurement data exceeds the volume allocated to a memory for data transmission via the bus by the addition or change of a measurement item due to changes in standards in an OTA test.

BEST MODE FOR CARRYING OUT THE INVENTION

Hereinafter, embodiments of the present invention will be described with reference to the drawings.

First Embodiment

Figure 1:
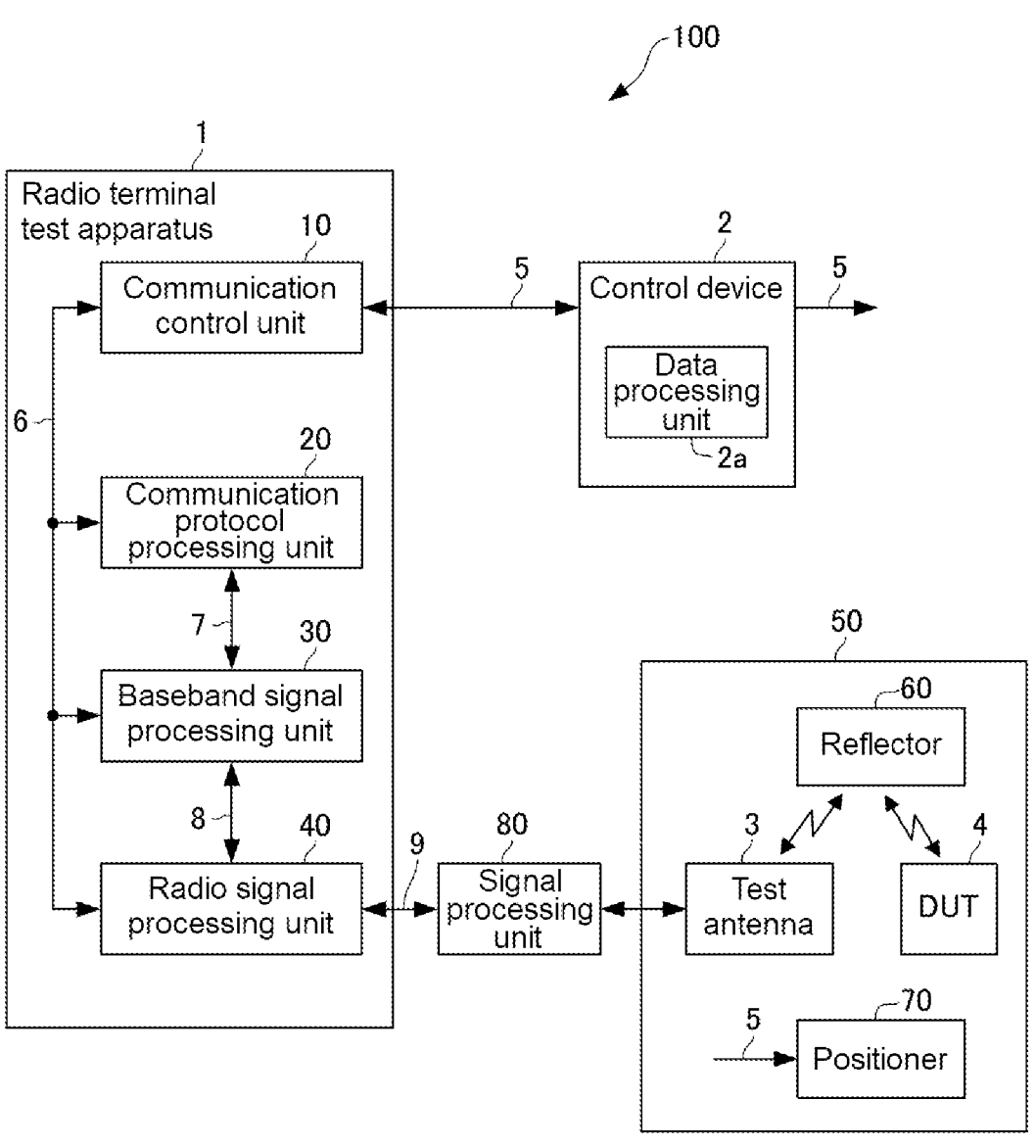
FIG. 1 is a diagram illustrating a schematic configuration of a radio terminal test apparatus according to an embodiment of the present invention.

FIG. 1 is a block diagram illustrating a schematic configuration of a radio terminal test apparatus (also referred to as a test apparatus below) 1 according to a first embodiment of the present invention. The test apparatus 1 according to the present embodiment is used, for example, to measure the communication performance of, for example, a 5G radio terminal (DUT) 4 under an OTA environment. The OTA environment is an environment in which a radio communication performance test can be performed without being influenced by an external radio wave environment. A configuration of performing a performance test of a 5G radio terminal under an OTA environment will be described below as an example.

First, an overall radio terminal test system (also referred to as a test system below) 100 according to the present embodiment will be described. As illustrated in FIG. 1, the test system 100 includes the test apparatus 1, a control device 2, a signal processing unit 80, an anechoic box 50, a test antenna 3, a reflector 60, and a positioner 70.

(Test Apparatus)

The test apparatus 1 generates a test signal to be transmitted to a DUT 4 in a performance test of the DUT 4, receives a response signal (measurement target signal) transmitted from the DUT 4 that has received the test signal, measures power and the like, and transmits the measurement result to the control device 2. The test apparatus 1 in the present embodiment has a function of measuring the communication performance of the DUT 4 and a function of simulating communication standards such as 5G. Therefore, the test apparatus 1 includes a communication control unit 10, a communication protocol processing unit 20, a baseband signal processing unit 30, and a radio signal processing unit 40.

Figure 2:
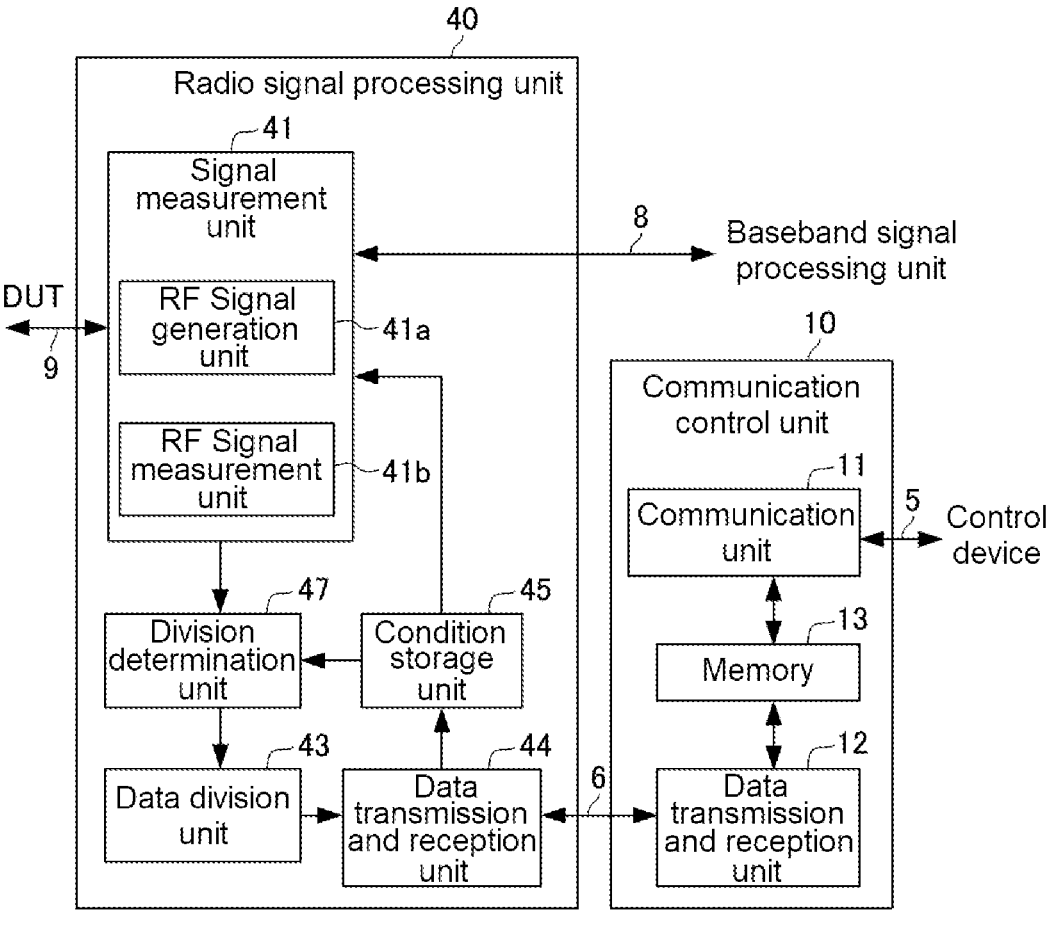
FIG. 2 is a diagram illustrating a schematic configuration of a radio signal processing unit and a communication control unit according to the embodiment of the present invention.

The communication control unit 10 has a gateway function, transmits and receives data to and from the radio signal processing unit 40 via a serial bus 6 in accordance with a first protocol, and transmits and receives data to and from the external control device 2 via a network 5 in accordance with a second protocol. Specifically, as illustrated in FIG. 2, the communication control unit 10 includes a communication unit 11 that performs data communication with the control device 2 via the network 5 such as Ethernet (registered trademark), a data transmission and reception unit 12 that transmits and receives data to and from the radio signal processing unit 40 via the serial bus 6 such as PCIe (registered trademark), and a memory 13 used to transmit and receive data. Also, the communication control unit 10 performs integrated control such as power on/off of the communication protocol processing unit 20, the baseband signal processing unit 30, and the radio signal processing unit 40 via the serial bus 6.

Returning to FIG. 1, the communication protocol processing unit 20 generates, for example, U-plane transmission data based on a communication protocol defined by a specific communication standard such as 5G. The generated transmission data is transmitted to the baseband signal processing unit 30 via a wiring 7. The communication protocol processing unit 20 also performs processing such as error correction based on a baseband signal transmitted from the baseband signal processing unit 30 via the wiring 7. The communication protocol processing unit 20 is connected to the communication control unit 10 via the serial bus 6.

The baseband signal processing unit 30 generates a baseband signal (digital IQ data) from the transmission data generated by the communication protocol processing unit 20. The I-component baseband signal and the Q-component baseband signal are transmitted to the radio signal processing unit 40 via a wiring 8. The baseband signal processing unit 30 measures the throughput and the communication rate of a radio signal transmitted from the DUT 4 based on the I-component baseband signal and the Q-component baseband signal transmitted from the radio signal processing unit 40 via the wiring 8. The baseband signal processing unit 30 is connected to the communication control unit 10 via the serial bus 6.

The radio signal processing unit 40 performs measurement processing on the radio signal transmitted from the DUT 4 and acquires measurement data D. Specifically, the radio signal processing unit 40 generates a radio frequency (RF) test signal from the baseband signal, and outputs the generated RF test signal to the signal processing unit 80 via a wiring 9. The radio signal processing unit 40 performs signal processing (measurement processing) for measurement on the radio signal received from the DUT 4 that has received the test signal via the test antenna 3 and the signal processing unit 80, and measures power and the like. The radio signal processing unit 40 is also connected to the communication control unit 10 via the serial bus 6.

The radio signal processing unit 40 may acquire measurement data of the equivalent isotropically radiated power (EIRP) at each angle sample point by entire spherical surface scanning of the DUT 4 that performs radio communication in accordance with a communication standard using carrier aggregation.

With the configuration of the test apparatus 1 described above, the test apparatus 1 can test the radio communication characteristics of the DUT 4 by simulating a base station of a specific communication standard such as 5G NR. All or some of the modules that perform digital processing in the test apparatus 1 may be configured by a computer device having a CPU, a ROM, a RAM, an SSD, and the like.

As illustrated in FIG. 2, the radio signal processing unit 40 includes a signal measurement unit 41, a data division unit 43, a data transmission and reception unit 44, a condition storage unit 45, and a division determination unit 47.

The signal measurement unit 41 includes an RF signal generation unit 41*a* and an RF signal measurement unit 41*b*.

The RF signal generation unit 41*a* acquires waveform data having a reference waveform, specifically, for example, an I-component baseband signal and a Q-component baseband signal that is an orthogonal component signal thereof, from the baseband signal processing unit 30 via the wiring 8. The I-component baseband signal and the Q-component baseband signal are converted from digital signals to analog signals by digital-to-analog converters (DACs). The RF signal generation unit 41*a* performs modulation processing of mixing a local signal with each of the converted I-component baseband signal and the converted Q-component baseband signal, combining both signals, and outputting a result of the combination having a digital modulation frequency. Then, a test signal corresponding to the frequency of each communication standard is generated by converting the frequency of the combined signal, and the generated test signal is output to the signal processing unit 80. The signal processing unit 80 performs processing such as frequency conversion (for example, up-conversion), amplification, and frequency selection on the test signal, and then outputs the test signal to the DUT 4 by the test antenna 3.

Then, the test antenna 3 receives a response signal (measurement target signal) transmitted by the DUT 4 that has received the test signal, and outputs the received measurement target signal to the signal processing unit 80. The signal processing unit 80 performs processing such as frequency conversion (for example, down-conversion), amplification, and frequency selection on the measurement target signal input from the test antenna 3, and then transmits the measurement target signal to the radio signal processing unit 40.

The RF signal measurement unit 41*b* of the signal measurement unit 41 performs processing of signal measurement (or analysis) on the measurement target signal transmitted from the signal processing unit 80. In this processing, first, the measurement target signal is received, and then the measurement target signal is mixed with the local signal to convert the measurement target signal into an intermediate frequency band signal (IF signal). Then, processing of converting the IF signal from an analog signal to a digital signal, performing digital processing to generate waveform data corresponding to the I-component baseband signal and the Q-component baseband signal, respectively, transmitting the generated waveform data to the baseband signal processing unit 30, and analyzing the I-component baseband signal and the Q-component baseband signal based on the waveform data is performed.

The RF signal measurement unit 41*b* of the signal measurement unit 41 performs processing such as frequency conversion, amplification, and frequency selection on a radio signal in a frequency band including the target frequency band, which has been received by the test antenna 3. Then, the RF signal measurement unit 41*b* performs measurement processing on the radio signal to measure a physical quantity such as power.

The condition storage unit 45 stores the measurement condition transmitted from the control device 2 via the network 5 and the serial bus 6, and the volume $V_2$ of a data transmission and reception region allocated in the memory 13 of the communication control unit 10. The measurement condition includes measurement items, a target frequency band, a channel frequency band, the number of channels, a frequency band of a spurious signal, the number of angle samples (number of measurement points) for entire spherical surface scanning, and the like.

The division determination unit 47 determines the necessity of the division of the measurement data acquired by the signal measurement unit 41. Specifically, the division determination unit 47 determines whether or not the measurement data acquired by the signal measurement unit 41 can be transmitted once (or once or collectively) from the radio signal processing unit 40 to the communication control unit 10 via the serial bus 6. More specifically, the division determination unit 47 determines the necessity of the division of the measurement data by determining whether or not the data volume $V_1$ of the measurement data acquired by the signal measurement unit 41 of the radio signal processing unit 40 is larger than the volume $V_2$ of the data transmission and reception region allocated in the memory 13 of the communication control unit 10.

The data division unit 43 divides the measurement data when the division determination unit 47 determines that the measurement data needs to be divided. Specifically, when the division determination unit 47 determines that the measurement data needs to be divided, the data division unit 43 calculates the number of divisions N of the measurement data by the following expression N=ROUNDUP ($V_1/V_2$). Then, the data division unit 43 divides the measurement data into N pieces in accordance with the number of divisions N. Here, $V_1$ indicates the volume of the measurement data, $V_2$ indicates the volume of the data transmission and reception region allocated in the memory 13 of the communication control unit 10, and ROUNDUP indicates rounding-up processing.

With this configuration, the number of divisions N of the measurement data can be calculated from the data volume $V_1$ of the measurement data and the volume $V_2$ of the data transmission and reception region allocated in the memory 13 of the communication control unit 10. Thus, it is possible to reliably divide the measurement data.

The data division unit 43 sets the number of divisions N to 1 when the division determination unit 47 determines that division of the measurement data is unnecessary.

The data transmission and reception unit 44 division-transmits the pieces of the measurement data divided by the data division unit 43, a plurality of times, from the radio signal processing unit 40 to the communication control unit 10 via the serial bus 6 in accordance with the first protocol. Specifically, when the number of divisions N is more than 1, the data transmission and reception unit 44 sequentially transmits the measurement data divided into N pieces by the data division unit 43, N times, to the data transmission and reception unit 12 of the communication control unit 10 via the serial bus 6. The volume $V_3$ of the divided measurement data to be divided and transmitted may be equal to or less than the volume $V_2$ of the region allocated in the memory 13 of the communication control unit 10, and it is not necessary to divide the volume into equal data volume. When the division number N is 1, the data transmission and reception unit 44 transmits the measurement data to the data transmission and reception unit 12 of the communication control unit 10 via the serial bus 6 at once. Even when data is divided and transmitted a plurality of times, the data transmission region allocated in the memory 13 of the communication control unit 10 is used for one transmission, and the one transmission is performed by batch processing (process) in which transmission data of a predetermined volume $V_3$ which is equal to or less than the volume $V_2$ of the data transmission region is transmitted.

Figure 3A:
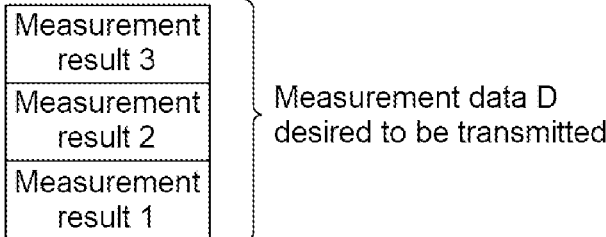
FIG. 3A illustrates a configuration of transmission data.
Figure 3B:
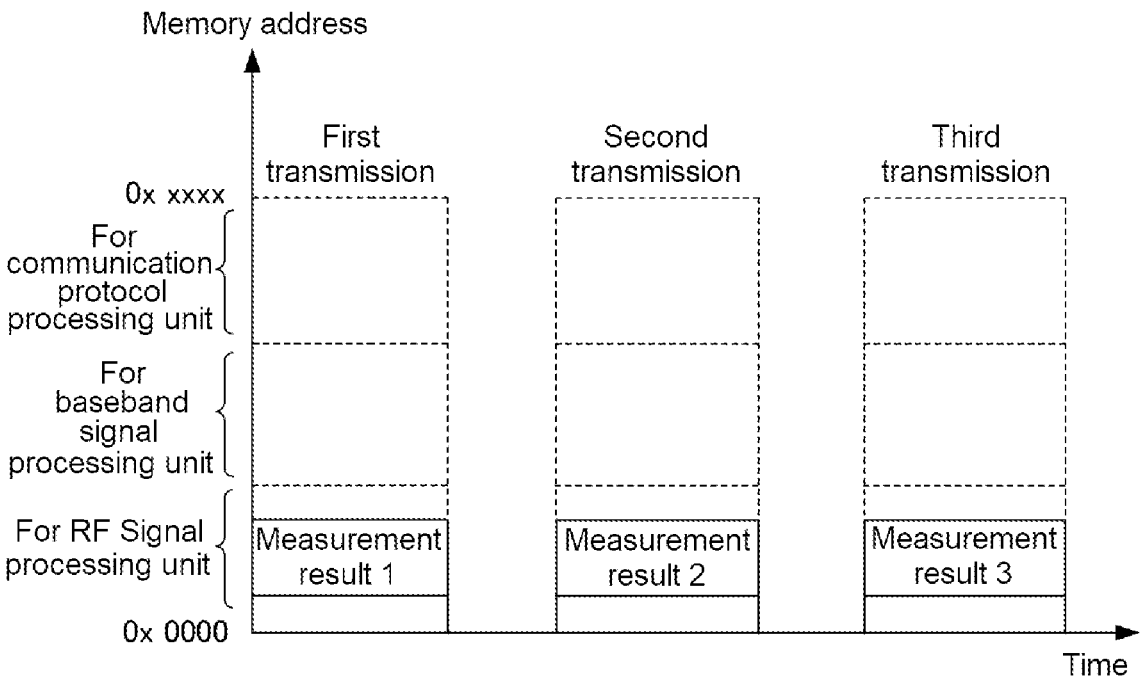
FIG. 3B is a diagram for explaining a memory allocation status of a communication control unit during data transmission.

FIG. 3A illustrates the configuration of the measurement data D to be transmitted, and FIG. 3B is a diagram for explaining the allocation status of the memory 13 (for example, 32 MB) of the communication control unit 10 during data transmission.

As illustrated in FIG. 3A, for example, when the number of divisions N is 3, the measurement data (measurement result) D acquired by the radio signal processing unit 40 is divided into three pieces of measurement results 1, 2, and 3.

As illustrated in FIG. 3B, the data transmission and reception memory 13 of the communication control unit 10 includes a fixed region allocated for the radio signal processing unit 40, a fixed region allocated for the baseband signal processing unit 30, a fixed region allocated for the communication protocol processing unit 20. Specifically, a predetermined region of the memory region allocated for the radio signal processing unit 40 is fixedly allocated for data transmission and reception by the serial bus 6. The memory volume $V_2$ allocated for data transmission and reception is the maximum value of the data volume that allows one data transmission. In FIG. 3B, the measurement result is divided and transmitted three times by using the memory region (for example, 8 MB) allocated for data transmission and reception to and from the radio signal processing unit 40 in the memory 13 of the communication control unit 10.

Figure 4:
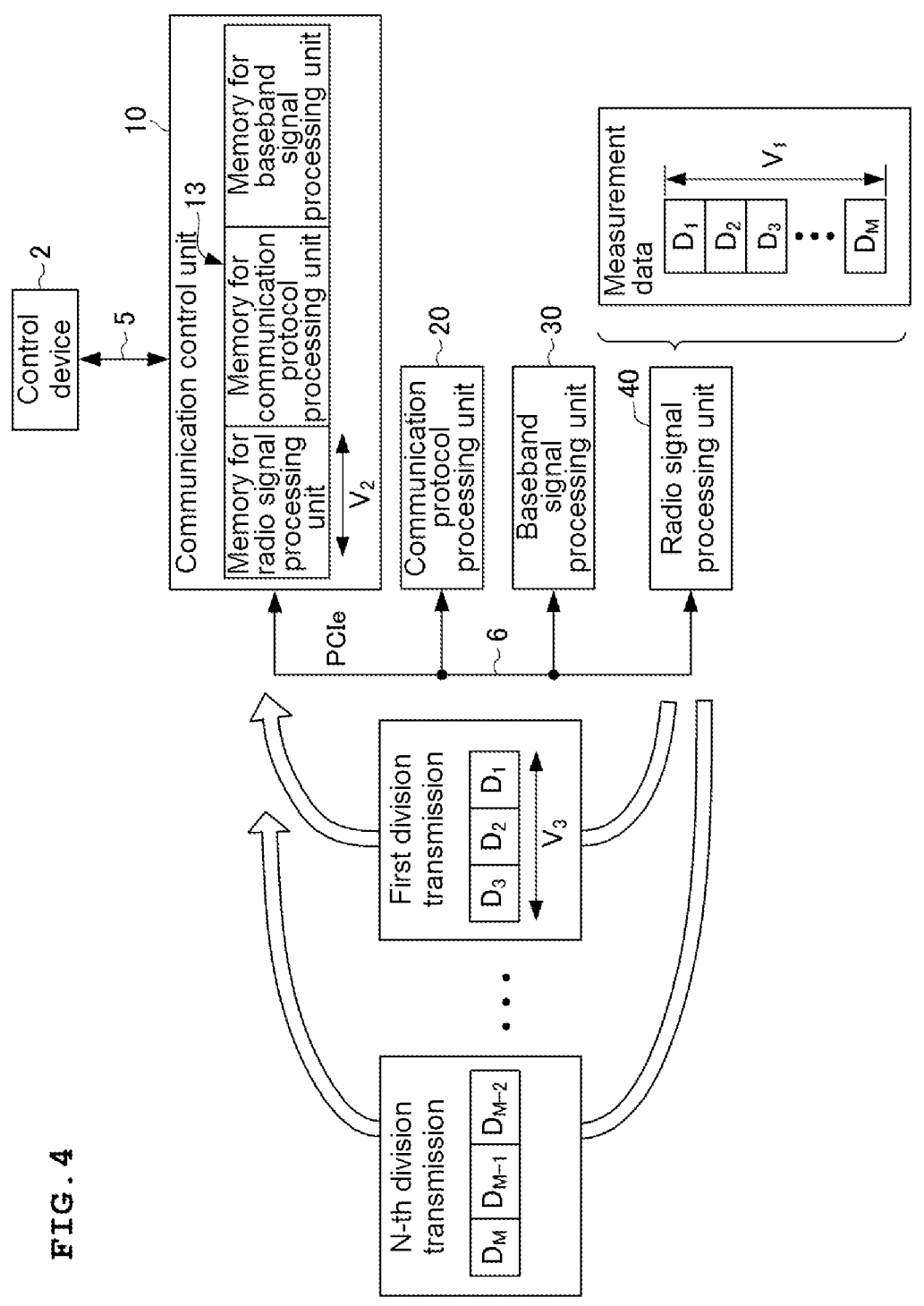
FIG. 4 is a diagram for explaining a method of division and transmission of data.

FIG. 4 is a diagram for explaining a method of division-transmitting the measurement data, for example, in a case of the number of divisions N (N>1). As illustrated in FIG. 4, the radio signal processing unit 40 acquires measurement data D with a data volume of $V_1$. The measurement data D includes M pieces of data $D_1, D_2, \ldots,$ and $D_M$. Assuming that the data volume $V_3$ that can be transmitted at one time corresponds to three pieces of data, pieces of data $D_1, D_2,$ and $D_3$ are transmitted to the communication control unit 10 in the first division transmission. Thereafter, division transmission is performed in order, and data $D_{M-2}, D_{M-1},$ and $D_M$ are transmitted to the communication control unit 10 at the N-th division transmission. In this manner, all pieces of measurement data $D_1, D_2, \ldots,$ and $D_M$ are division-transmitted from the radio signal processing unit 40 to the communication control unit 10 via the serial bus 6.

In FIG. 4, when the memory volume of the data transmission and reception region for the radio signal processing unit in the memory 13 of the communication control unit 10 is indicated by $V_2$, the data volume $V_1$ of the measurement data D in the case of division transmission, the memory volume $V_2$ of the data transmission and reception region for the radio signal processing unit, and the data volume $V_3$ that can be transmitted at once have a relationship of $V_1 > V_2 \geq V_3$.

(Control Device)

Returning to FIG. 1, the control device 2 is also referred to as an integrated control device, and is connected to the test apparatus 1 and the positioner 70 via the network 5 such as Ethernet so as to be able to communicate with each other. The control device 2 collectively controls the test apparatus 1 and the positioner 70 via the network 5, and is configured by, for example, a personal computer.

The control device 2 may include a data processing unit 2a that calculates the total radiated power (TRP) of the DUT 4 from the measurement data acquired by the radio signal processing unit 40. The TRP may be calculated by the radio signal processing unit 40. The data processing unit 2a corresponds to a calculation unit in the present invention.

With this configuration, it is possible to accurately and reliably measure the TRP by division-transmitting all pieces of measurement data of EIRP acquired by the radio signal processing unit 40 even in TRP measurement with a large volume of the measurement data, and by obtaining the sum of the EIRP in the control device 2 being the transmission destination, for example.

Specifically, the control device 2 includes a control unit, an operation unit, and a display unit. The control unit is configured by, for example, a computer device. The computer device includes a central processing unit (CPU) that performs predetermined information processing for realizing the functions of the radio terminal test system 100 and overall control of the test apparatus 1 and the positioner 70, a read only memory (ROM) that stores an operating system (OS) for starting up the CPU, other programs, control parameters, and the like, a random access memory (RAM) that stores execution codes of the OS used for the CPU to run and applications, data, and the like, an external interface (I/F) unit that has an input interface function of receiving an input of a predetermined signal and an output interface function of outputting a predetermined signal, a non-volatile storage medium such as a solid state drive (SSD) and a hard disk drive, and various input and output ports.

(Anechoic Box)

The anechoic box (OTA chamber) 50 realizes an OTA test environment when a DUT 4 such as a 5G radio terminal is tested, and is used as an example of the CATR described above. The OTA chamber 50 is configured by, for example, a metal housing having a rectangular parallelepiped internal space, and accommodates the DUT 4 including an antenna, one or a plurality of test antennas 3, the reflector 60, and the positioner 70 in the internal space.

A radio wave absorber is attached to the entire inner surface of the OTA chamber 50. As a result, the OTA chamber 50 has the reinforced function in which each element (the DUT 4, the test antenna 3, the reflector 60, and the positioner 70) disposed in the internal space restricts the intrusion of radio waves from the outside and the radiation of radio waves to the outside. As described above, the OTA chamber 50 realizes the anechoic box having the internal space that is not influenced by the surrounding radio wave environment. The anechoic box used in the present embodiment is, for example, an anechoic type.

(DUT)

The DUT 4 is a radio terminal that transmits and receives radio signals in a millimeter wave band, which are compatible with 5G cellular such as smartphones, home routers, and CPEs that transmit and receive radio signals in a millimeter wave band, which are compatible with IEEE802.11ad and 5G cellular. The DUT 4 may be a radio terminal compatible with Cellular (LTE, LTE-A, W-CDMA (registered trademark), GSM (registered trademark), CDMA2000, 1×EV-DO, TD-SCDMA, and the like), wireless LAN (IEEE802.11b/g/a/n/ac/ad and the like), Bluetooth (registered trademark), GNSS (GPS, Galileo, GLONASS, BeiDou, and the like), FM, and digital broadcasting (DVB-H, ISDB-T, and the like).

In the present embodiment, the antenna of the DUT 4 uses, for example, a radio signal in a prescribed frequency band (target frequency band) based on the 5G NR standard. Specifically, the antenna of the DUT 4 may use, for example, a frequency band included in FR2 defined by 3GPP as the prescribed frequency band. The 5G NR standard uses carrier aggregation using a plurality of frequency bands (channels or component carriers), which is one of the factors that increase the volume $V_1$ of the measurement data D.

In the internal space of the OTA chamber 50, the DUT 4 is held by the positioner 70, which is a DUT scanning mechanism. The positioner 70 holds the DUT 4, which is the target of the performance test, and performs entire spherical surface scanning of the DUT 4, which will be described later.

(Test Antenna)

The test antenna 3 is accommodated in the OTA chamber 50 and performs radio communication with the DUT 4. The test antenna 3 is attached to a required position on the bottom surface of a housing of the OTA chamber 50 by using an appropriate holder (not illustrated). When the performance test of the DUT 4 is performed in the OTA chamber 50, the test antenna 3 transmits a test signal to the DUT 4 and receives a measurement target signal transmitted from the DUT 4 that has received the test signal. The test antenna 3 can transmit and receive radio signals in the same prescribed frequency band as the antenna of the DUT 4 (for example, the frequency band included in FR2 defined by 3GPP).

For example, the test antenna 3 can be used for TRP measurement, and can transmit and receive radio signals in a prescribed frequency band with the antenna of the DUT 4 during the performance test of the DUT 4.

The reflector 60 has, for example, an offset parabolic structure and is attached at a required position on the inner side surface of the OTA chamber 50 by using a reflector holder. The reflector 60 realizes a radio wave path for returning radio signals (test signal and measurement target signal) transmitted and received by the antenna of the DUT 4 to a light receiving surface of the test antenna 3.

Although one test antenna 3 is used in the present embodiment, the present invention is not limited to this, and a plurality of test antennas 3 may be used.

(Positioner)

The positioner 70 is accommodated in the OTA chamber 50 and controls the posture of the DUT 4 under the control of the control device 2. The positioner 70 has, for example, a mechanism that rotates about an azimuth axis (vertical rotation axis) and a mechanism that rotates about a roll axis (horizontal rotation axis), and can rotate the held DUT 4 in the rotation directions of the two axes.

The positioner 70 assumes that the held DUT 4 is disposed at, for example, the center of a virtual sphere, and performs "entire spherical surface scanning" of sequentially changes the posture of the DUT 4 so that the antenna of the DUT 4 faces all directions on the entire surface of the virtual sphere.

(TRP Measurement)

Generally, for the radiation power measurement of the DUT 4, a method of measuring equivalent isotropically radiated power (EIRP) and a method of measuring total radiated power (TRP) are known. The EIRP is, for example, a power value measured at each measurement point $(\theta, \varphi)$ in a spherical coordinate system $(r, \theta, \varphi)$. On the other hand, the TRP is defined by measuring the EIRP in all directions of the spherical coordinate system $(r, \theta, \varphi)$, that is, at a plurality of angle sample points (defined in advance) on a virtual spherical surface at an equal distance from the center (referred to as a reference point below) of the entire spherical surface scanning of the DUT 4, and obtaining the sum of the EIRP.

The total radiated power TRP can be expressed, for example, by the following expression (1), where N and M indicate the division numbers in the $\theta$ and $\varphi$ directions of the spherical coordinate system $(r, \theta, \varphi)$ (see 3GPPTS38.521-2).

$$TRP \approx \frac{\pi}{2\,NM} \sum_{i=1}^{N-1} \sum_{j=0}^{M-1} [EIRP_\theta(\theta_i, \phi_j) + EIRP_\phi(\theta_i, \phi_j)]\sin(\theta_i) \tag{1}$$

The number of angle samples ($N_S$) with which the total radiated power TRP can be calculated based on the above expression (1) can be obtained by the following expression (2).

$$N_S = N_\theta \times N_\varphi \tag{2}$$

Here, $N_\theta = 180 \div (\text{angular interval}) + 1$, $N_\varphi = 360 \div (\text{angular interval})$. However, $0° \leq \theta \leq 180°$ and $0° \leq \varphi \leq 360°$.

For example, when the spherical surface is sampled at angular intervals of 30° between $\theta$ and $\varphi$, the number of angle samples Ns satisfies $Ns = N_\theta \times N_\varphi = (180/30+1) \times (360/30) = 7 \times 12 = 84$. Here, $0° \leq \theta \leq 180°$ and $0° \leq \varphi \leq 360°$.

In the radio terminal test apparatus 1 according to the present embodiment, for example, 84 ($=(6+1) \times 12$) is given as the angle sample points, and the EIRP is measured at each of the positions of the 84 point at an equal distance from the reference point of the spherical coordinate system $(r, \theta, \varphi)$. Further, the EIRP at all point positions is added. Then, "TRP measurement" of obtaining the total radiated power TRP of the DUT 4 based on the addition result of each EIRP, that is, the sum of EIRPs at all 84 angle sample points, is performed.

During the TRP measurement, the control device 2 drives and controls the positioner 70 via the network 5 to scan the entire spherical surface of the DUT 4. While the positioner 70 scans the entire spherical surface of the DUT 4 under the control of the control device 2, the radio signal processing unit 40 measures the power of the radio signal radiated from the antenna of the DUT 4 via the signal processing unit 80 and the test antenna 3. In this manner, in the radio terminal test system 100 in the present embodiment, TRP measurements with a large number of angle sample points on the entire spherical surface can be performed even for the DUT 4 conforming to a communication standard that uses carrier aggregation with a large number of channels, for example.

In the present embodiment, one test antenna 3 is disposed in the OTA chamber 50, and measurement is performed by repeating the entire spherical surface scanning for each frequency band (component carrier frequency band), but the configuration is not limited to this. By using a plurality of test antennas 3 and providing a plurality of signal measurement units 41, it is possible to simultaneously measure the EIRP in a plurality of frequency bands in one entire spherical surface scanning. In this manner, it is possible to realize shortening of the measurement time. Also, the frequency band to be measured may include the frequency band of the spurious signal.

(Test Method)

Next, a radio terminal test method (also referred to as a test method below) according to the present embodiment will be described by using TRP measurement as an example.

Figure 5:
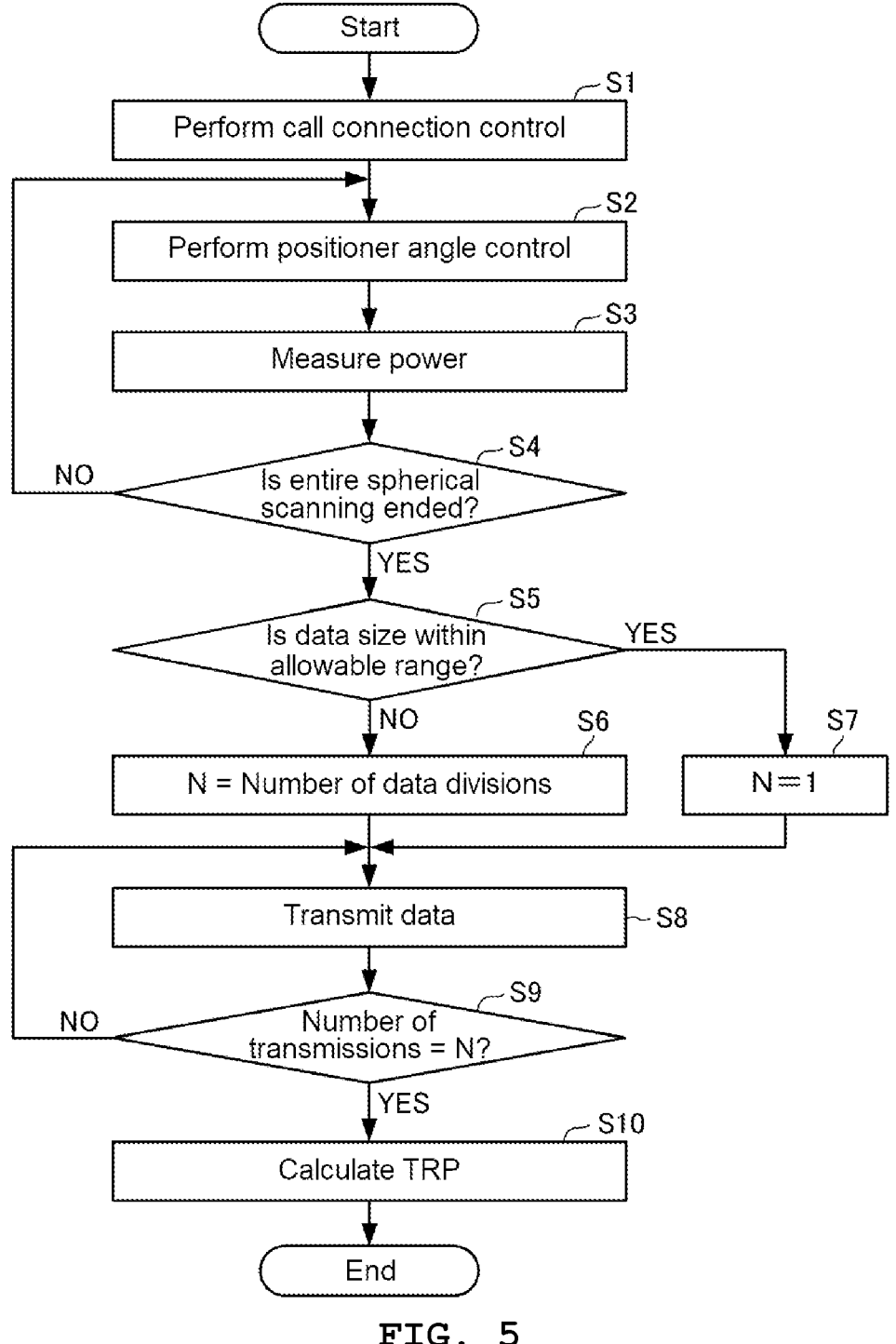
FIG. 5 is a diagram illustrating a flowchart of a radio terminal test method according to the embodiment of the present invention.

FIG. 5 is a flowchart of the test method according to the present embodiment. As illustrated in FIG. 5, first, the control device 2 uses the test apparatus 1 and the test antenna 3 to perform call connection control by transmitting and receiving control signals (radio signals) to and from the DUT 4 (Step S1). With the call connection control, a state in which radio signals in the prescribed frequency band can be transmitted and received via the test antenna 3 is established between the test apparatus 1 and the DUT 4. Then, the test apparatus 1 and the DUT 4 can transmit and receive radio signals for a performance test of the DUT 4.

Regarding the transmission and reception of radio signals for the performance test, the processing of receiving radio signals transmitted from the test apparatus 1 functioning as a 5G NR simulator via the test antenna 3 on the DUT 4 side is set as downlink (DL) processing. Conversely, the processing of transmitting a radio signal to the test apparatus 1 via the test antenna 3 is set as uplink (UL) processing. The test antenna 3 is used to perform the processing of establishing a link (call) and the processing of downlink (DL) and uplink (UL) after the link is established, and may be referred to as a link antenna.

The control device 2 controls the angle of the positioner 70 holding the DUT 4 via the network 5 such as Ethernet (Step S2). Specifically, the control device 2 controls the DUT 4 held by the two-axis positioner 70 for the entire spherical surface scanning. The control device 2 performs control so that the antenna plane of the antenna of the DUT 4 at the center of the spherical coordinate system (r, θ, φ) faces one angle sample point of a virtual sphere that defines the spherical coordinate system (r, θ, φ).

Then, the control device 2 transmits a signal transmission command to the test apparatus 1. The test apparatus 1 generates a test signal in accordance with a communication standard using carrier aggregation in response to a signal transmission command, and outputs the test signal to the test antenna 3 via an external signal processing unit 80. The test signal is transmitted from the test antenna 3 to the DUT 4. The DUT 4 receives the test signal and transmits a response signal (measurement target signal) to the test antenna 3 in response to the test signal.

The signal measurement unit 41 of the radio signal processing unit 40 receives the measurement target signal received by the test antenna 3 via the external signal processing unit 80, and measures the EIRP power for each channel (frequency band) (Step S3). The power measurement data D is represented by a data set of D=[f, θ, φ, P]. Where f indicates the frequency band (channel), θ and φ indicate the directions of the DUT 4 pointed by the positioner 70, and P indicates the measured power value.

Specifically, in Step S3, the signal measurement unit 41 of the radio signal processing unit 40 performs TRP measurement processing. The TRP measurement processing is measurement processing of the EIRP (equivalent isotropically radiated power) corresponding to the angle sample point to which the antenna plane of the test antenna 3 is oriented.

The control device 2 determines whether or not the entire spherical surface scanning of the positioner 70 has been ended (Step S4). When the entire spherical surface scanning has not been ended (NO in Step S4), the process returns to Step S2. When the entire spherical surface scanning has been ended (YES in Step S4), the process proceeds to Step S5.

In Step S5, the division determination unit 47 of the radio signal processing unit 40 determines whether or not the data size of the measurement data D is within an allowable range, that is, whether or not to divide the measurement data (Step S5). Specifically, the division determination unit 47 determines whether or not the measurement data obtained by the signal processing of the measurement in the radio signal processing unit 40 is larger than the volume $V_2$ of the data transmission and reception region of the memory 13 for the radio signal processing unit of the communication control unit 10.

When the measurement data is within the allowable range of the memory 13 (YES in Step S5), the data division unit 43 sets the division number N to 1 (Step S7), and transmits the measurement data to the data transmission and reception unit 44 without dividing the data. The data transmission and reception unit 44 transmits the measurement data to the data transmission and reception unit 12 of the communication control unit 10 via the PCIe serial bus 6 (Step S8).

When the measurement data exceeds the allowable range of the memory 13 (NO in Step S5), the data division unit 43 calculates the division number N (Step S6). Specifically, the data division unit 43 calculates the number of divisions N by, for example, the following expression. N=ROUNDUP $(V_1/V_2)$ where $V_1$ indicates the volume of the measurement data and $V_2$ indicates the volume of the data transmission and reception region in the memory 13 of the communication control unit 10 allocated for the radio signal processing unit 40. ROUNDUP means rounding-up processing.

The data division unit 43 divides the measurement data into N pieces and transmits the divided measurement data to the data transmission and reception unit 44. The data transmission and reception unit 44 sequentially transmits the measurement data divided into N pieces to the data transmission and reception unit 12 of the communication control unit 10 via the PCIe serial bus 6 N times (Steps S8 and S9).

The communication unit 11 of the communication control unit 10 transmits the measurement data transmitted from the radio signal processing unit 40 and stored in the memory 13 to the control device 2 via the network 5 such as Ethernet.

The control device 2 receives the measurement data transmitted from the test apparatus 1, and the data processing unit 2a calculates the TRP from the measurement data (Step S10).

Specifically, the control device 2 aggregates the EIRP measurement results based on the reception signals at all the angle sample points by the above expression (1), and calculates the sum of the EIRP measurement results as the total radiated power TRP. The total radiated power TRP may be calculated by the signal measurement unit 41 of the radio signal processing unit 40 and the calculation result may be transmitted to the control device 2.

The control device 2 stores the total radiated power TRP calculated in Step S10 in a storage region, displays the total radiated power TRP on the display unit, and ends the series of measurement processing described above.

Figure 6:
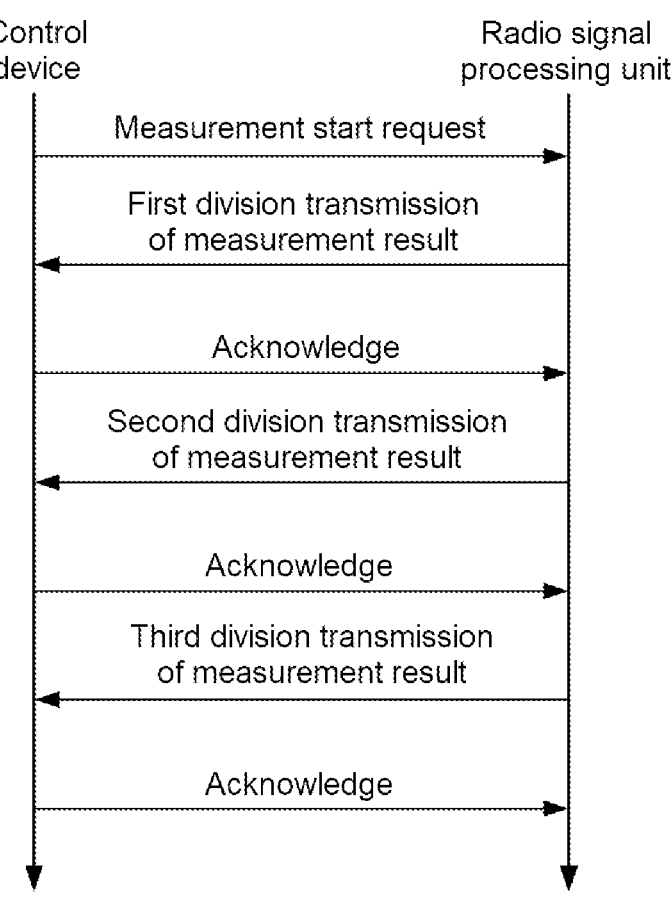
FIG. 6 is a sequence diagram for explaining a handshake procedure for data transmission between a control device and the radio signal processing unit.

FIG. 6 is a sequence diagram for explaining a handshake procedure for data transmission between the external control device 2 and the radio signal processing unit 40. FIG. 6 illustrates an example of division-transmitting measurement results 1, 2, and 3 obtained by dividing the measurement data D into three pieces. As illustrated in FIG. 6, first, the control device 2 transmits a measurement start request to the radio signal processing unit 40. Upon receiving the measurement start request, the radio signal processing unit 40 division-transmits the measurement result 1 to the control device 2 (first time). Upon receiving the measurement result 1, the control device 2 transmits an acknowledgement to the radio signal processing unit 40.

Upon receiving the acknowledgement, the radio signal processing unit 40 division-transmits the measurement result 2 to the control device 2 (second time). Upon receiving the measurement result 2, the control device 2 transmits an acknowledgement to the radio signal processing unit 40.

Upon receiving the acknowledgement, the radio signal processing unit 40 division-transmits the measurement result 3 to the control device 2 (third time). Upon receiving the measurement result 3, the control device 2 transmits an acknowledgement to the radio signal processing unit 40.

Action and Effect

As described above, in the test apparatus 1 according to the present embodiment, the radio signal processing unit 40 includes the division determination unit 47 that determines necessity of division of the measurement data. When the division determination unit 47 determines that the measurement data needs to be divided, the measurement data is divided, and divided pieces of the measurement data are division-transmitted a plurality of times from the radio signal processing unit 40 to the communication control unit 10 via the serial bus 6 in accordance with the first protocol. With this configuration, even when the data volume $V_1$ of the measurement data acquired by the radio signal processing unit 40 exceeds the memory volume $V_2$ of the memory for data transmission via the serial bus 6 due to the addition or change of a measurement item, it is possible to reliably transmit and receive measurement data to the communication control unit 10 from the radio signal processing unit 40 at low cost via the serial bus 6 without replacing hardware.

In addition, in the test apparatus 1 according to the present embodiment, the division determination unit 47 determines the necessity of the division of the measurement data by determining whether or not the measurement data acquired by the radio signal processing unit 40 is larger than the volume $V_2$ of the data transmission and reception region allocated in the memory 13 of the communication control unit 10. With this configuration, in the test apparatus 1 in the present embodiment, all pieces of measurement data are acquired by the radio signal processing unit 40, and then it is determined whether or not the measurement data is larger than the volume $V_2$ of the data transmission and reception region allocated in the memory 13 of the communication control unit 10. Thus, it is possible to reliably determine the necessity of division of the measurement data without considering a measurement condition.

Second Embodiment

Next, a test apparatus 1 according to a second embodiment of the present invention will be described with reference to the drawings.

Figure 7:
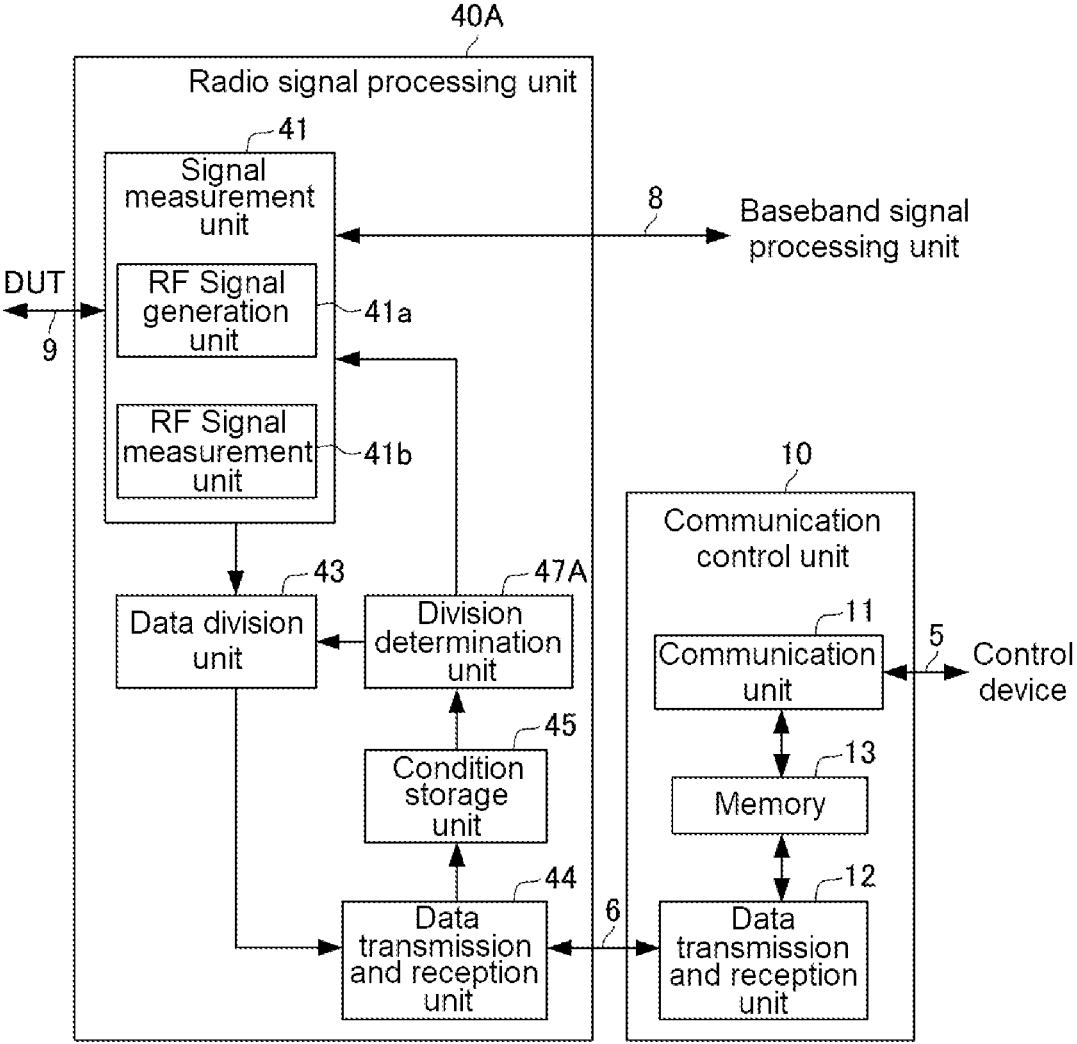
FIG. 7 is a diagram illustrating a schematic configuration of a radio signal processing unit and a communication control unit according to another embodiment of the present invention.

As illustrated in FIG. 7, the test apparatus 1 according to the present embodiment differs from the first embodiment in the configuration of a radio signal processing unit 40A. Other configurations are the same as those of the first embodiment, and the same configurations are denoted by the same reference signs, and detailed description thereof will be omitted as appropriate.

As illustrated in FIG. 7, the radio signal processing unit 40A in the test apparatus 1 according to the present embodiment includes a signal measurement unit 41, a data division unit 43, a data transmission and reception unit 44, a condition storage unit 45, and a division determination unit 47A.

The division determination unit 47A calculates, in advance, the data volume $V_1$ of the measurement data scheduled to be acquired by the radio signal processing unit 40 based on the measurement condition stored in the condition storage unit 45, and determines the necessity of the division of the measurement data by determining whether or not the calculated data volume $V_1$ is larger than the memory volume $V_2$ of the data transmission and reception region allocated in the memory 13 of the communication control unit 10. When the measurement data is larger than the memory volume $V_2$, the data division unit 43 calculates the number of divisions N and divides the measurement data in accordance with the number of divisions N.

For example, a case where TRP measurement is performed for a 5G radio terminal that performs carrier aggregation communication by using $N_1$ frequency bands (for example, component carriers) is considered. The number of samples acquired by the entire spherical surface scanning is set as $N_2$. The measurement data D is represented by D=[f, $\theta$, $\phi$, P]. Here, f indicates a frequency band, $\theta$ and $\phi$ indicate directions, and P indicates a power value. The number of pieces of data is $N_1 \times N_2$. When the data volume per measured value of the power P is set as d bytes, the data volume $V_1$ of the measurement data D is $V_1 = N_1 \times N_2 \times d$ bytes.

The division determination unit 47A compares the data volume $V_1$ of the measurement data D with the volume $V_2$ of the region allocated for data transmission and reception to and from the radio signal processing unit 40A in the memory 13 of the communication control unit 10. When the data volume $V_1$ of the measurement data D is larger, it is determined that the data division is necessary. When the data volume $V_1$ of the measurement data D is not larger, it is determined that the data division is not necessary. When it is determined that data division is necessary, the division determination unit 47A calculates the number of divisions N by using the expression. $N=\text{ROUNDUP}((N_1 \times N_2 \times d)/V_2)$ where ROUNDUP means rounding-up processing.

The data division unit 43 divides the measurement data into N pieces in accordance with the number of divisions N, and sequentially transmits the divided pieces to the data transmission and reception unit 44. The data transmission and reception unit 44 division-transmits the measurement data divided into N pieces to the data transmission and reception unit 12 of the communication control unit 10 via the serial bus 6 N times.

With this configuration, in the test apparatus 1 in the present embodiment, the data volume $V_1$ of the measurement data scheduled to be acquired by the radio signal processing unit 40 is calculated in advance based on the measurement condition, and it is determined in advance whether or not the calculated data volume $V_1$ is larger than the volume $V_2$ of the data transmission and reception region allocated in the memory 13 of the communication control unit 10. Thus, it is possible to quickly divide and transmit measurement data without needing to perform determination processing when the radio signal processing unit 40 acquires the measurement data. The measurement condition includes, for example, a measurement item such as a TRP, the number of component carriers in carrier aggregation, and the total number of angle sample points in the entire spherical surface scanning.

In the above-described first and second embodiments, the communication performance test of the 5G radio terminal under the OTA environment has been described as an example, but the application of the test apparatus of the present invention is not limited to this. The present invention can be applied to a test apparatus configured to transmit data obtained by signal processing of a radio signal to a communication control unit with limited memory via a serial bus.

In each of the above-described embodiments, an example of covering a predetermined frequency range with one test antenna 3 is given, but the present invention is not limited to this, and any frequency range may be configured to be covered with any number of test antennas 3. Also, the positions and the number of angle sample points can be set freely. The present invention can be applied not only to an anechoic box but also to an anechoic chamber.

In each of the above-described embodiments, each module in the test apparatus 1 is configured to be connected by the serial bus 6, but the embodiments are not limited to this. The module may be configured to be connected by any form of bus such as a parallel bus or various expansion buses.

INDUSTRIAL APPLICABILITY

As described above, in the radio terminal test apparatus and radio terminal test method according to the present invention, an effect that, even when the volume of measurement data exceeds the volume allocated in the memory for data transmission via the bus by the addition or change of measurement items due to changes in standards in OTA tests, it is possible to reliably transmit and receive measurement data to the communication control unit from the radio signal processing unit via the bus at low cost without replacing hardware. In particular, it is useful for general radio terminal test apparatuses and radio terminal test methods that perform TRP measurements of 5G radio terminals that perform communication by using multi-channel carrier aggregation.

DESCRIPTION OF REFERENCE NUMERALS AND SIGNS

1: radio terminal test apparatus test (test apparatus)
2: control device
3: test antenna
4: DUT (radio terminal)
5: network (Ethernet)
6: serial bus (PCIe)
7, 8, 9: wiring
10: communication control unit
11: communication unit
12: data transmission and reception unit
13: memory
20: communication protocol processing unit
30: baseband signal processing unit
40, 40A: radio signal processing unit
41: signal measurement unit
41$a$: RF signal generation unit
41$b$: RF signal measurement unit
43: data division unit
44: data transmission and reception unit
45: condition storage unit
47, 47A: division determination unit
50: anechoic box (OTA chamber)
60: reflector
70: positioner
80: signal processing unit
100: radio terminal test system

What is claimed is:

1. A radio terminal test apparatus that tests radio communication performance of a radio terminal, the apparatus comprising:
   a radio signal processing unit that performs measurement processing on a radio signal transmitted from the radio terminal and acquires measurement data;
   a communication control unit that transmits and receives data to and from the radio signal processing unit; and
   a bus that connects the radio signal processing unit and the communication control unit,
   wherein the radio signal processing unit includes a division determination unit that determines necessity of division of the measurement data, and
   when the division determination unit determines that the measurement data needs to be divided, the measurement data is divided, and divided pieces of the measurement data are division-transmitted a plurality of times from the radio signal processing unit to the communication control unit via the bus.

2. The radio terminal test apparatus according to claim 1, wherein
   the division determination unit determines the necessity of the division of the measurement data by determining whether or not the measurement data acquired by the radio signal processing unit is larger than volume of a data transmission and reception region allocated in a memory of the communication control unit.

3. The radio terminal test apparatus according to claim 1, wherein
   the radio signal processing unit further includes a condition storage unit that stores a measurement condition, and
   the division determination unit
   calculates, in advance, volume of measurement data scheduled to be acquired by the radio signal processing unit, based on the measurement conditions, and
   determines the necessity of the division of the measurement data by determining whether or not the calculated volume is larger than volume of a data transmission and reception region allocated in a memory of the communication control unit.

4. The radio terminal test apparatus according to claim 1, wherein
   the radio signal processing unit further includes a data division unit that, when the division determination unit determines that the measurement data needs to be divided, calculates the number of divisions N of the measurement data by an expression N=ROUNDUP ($V_1$/$V_2$), and divides the measurement data in accordance with the number of divisions, where $V_1$ indicates volume of the measurement data, $V_2$ indicates volume of a data transmission and reception region allocated in a memory of the communication control unit, and ROUNDUP indicates rounding-up processing.

5. The radio terminal test apparatus according to claim 1, wherein
   the radio signal processing unit acquires measurement data of equivalent isotropically radiated power (EIRP) at each angle sample point by entire spherical surface scanning of the radio terminal that performs radio communication in accordance with a communication standard using carrier aggregation.

6. The radio terminal test apparatus according to claim 1, further comprising:
   a communication protocol processing unit that is connected to the bus and generates transmission data based on a communication protocol defined by a specific communication standard; and
   a baseband signal processing unit that is connected to the bus and generates a baseband signal from the transmission data,
   wherein the radio signal processing unit
   generates a radio-frequency test signal from the baseband signal,
   transmits the radio-frequency test signal to the radio terminal via a test antenna, and
   receives a radio signal transmitted from the radio terminal that has received the radio-frequency test signal.

7. A radio terminal test system that tests radio communication performance of a radio terminal, the system comprising:
   a radio terminal test apparatus including
   a radio signal processing unit that performs measurement processing on a radio signal transmitted from the radio terminal and acquires measurement data,
   a communication control unit that transmits and receives data to and from the radio signal processing unit, and a bus that connects the radio signal processing unit and the communication control unit, in which the radio signal processing unit includes a division determination unit that determines necessity of division of the measurement data, and, when the division determination unit determines that the measurement data needs to be divided, the measurement data is divided, and divided pieces of the measurement data are division-transmitted a plurality of times from the radio signal processing unit to the communication control unit via the bus;

a control device that transmits and receives data to and from the communication control unit via a network;

an anechoic box;

a positioner that is accommodated in the anechoic box and controls a posture of the radio terminal under control of the control device; and a test antenna that is accommodated in the anechoic box and performs radio communication with the radio terminal, wherein, while the positioner performs entire spherical surface scanning of the radio terminal under control of the control device, the radio signal processing unit measures power of a radio signal radiated from an antenna of the radio terminal via the test antenna.

8. The radio terminal test system according to claim 7, wherein the control device includes a calculation unit that calculates total radiated power (TRP) of the radio terminal from the measurement data acquired by the radio signal processing unit.

9. A radio terminal test method in a radio terminal test apparatus that includes a radio signal processing unit that performs measurement processing on a radio signal transmitted from a radio terminal and acquires measurement data, a communication control unit that transmits and receives data to and from the radio signal processing unit, and a bus that connects the radio signal processing unit and the communication control unit, and tests radio communication performance of the radio terminal, the method comprising:

a division determination step of determining necessity of division of the measurement data;

a data division step of, when it is determined in the division determination step that the measurement data needs to be divided, calculating the number of divisions and dividing the measurement data in accordance with the number of divisions; and a data transmission step of division-transmitting divided pieces of the measurement data from the radio signal processing unit to the communication control unit in a plurality of times via the bus.

* * * * *